United States Patent [19]

Thomas et al.

[11] Patent Number: 4,672,579

[45] Date of Patent: Jun. 9, 1987

[54] MTL STORAGE CELL WITH INHERENT OUTPUT MULTIPLEX CAPABILITY

[75] Inventors: Vincent P. Thomas, Eastleigh; Roderick M. P. West, North Baddesley; John P. Woodley, Romsey, both of England

[73] Assignee: International Business Machines Corporation, Armonk, N.Y.

[21] Appl. No.: 737,604

[22] Filed: May 24, 1985

[30] Foreign Application Priority Data

Jun. 25, 1984 [EP] European Pat. Off. ........ 84304301.9

[51] Int. Cl.$^4$ .............................................. G11C 7/00
[52] U.S. Cl. .................................. 365/155; 365/190; 357/92; 307/459; 307/477
[58] Field of Search ............... 365/155, 156, 179, 189, 365/190, 230; 307/459, 477, 299 B; 357/92

[56] References Cited

U.S. PATENT DOCUMENTS

| | | | |
|---|---|---|---|
| 3,986,178 | 10/1976 | McElroy | 365/190 |
| 4,122,542 | 10/1978 | Camerik et al. | 365/156 |
| 4,203,051 | 5/1980 | Hallett et al. | 315/13 C |
| 4,366,554 | 12/1982 | Aoki et al. | 365/156 |
| 4,470,061 | 9/1984 | Nakai | 357/92 |

FOREIGN PATENT DOCUMENTS

| | | |
|---|---|---|
| 1284257 | 8/1972 | United Kingdom . |
| 1374058 | 11/1974 | United Kingdom . |
| 1480138 | 7/1977 | United Kingdom . |
| 1569800 | 6/1980 | United Kingdom . |

OTHER PUBLICATIONS

IEEE Journal of Solid State Circuits, vol. SC-7, No. 5, Oct. 1972, pp. 340ff-346ff, Berger et al., "Merged--Transistor Logic (MTL)—A Low-Cost Bipolar Logic Concept".

Primary Examiner—James W. Moffitt
Assistant Examiner—Glenn A. Gossage
Attorney, Agent, or Firm—Stephen J. Limanek

[57] ABSTRACT

Semiconductor integrated word organized store comprising a two-dimensional array of bistable storage cells linked by orthogonal word lines and pairs of bit lines. Each cell consists of two cross-coupled merged transistor logic (MTL) gates having a structure providing a vertical inverting base transistor and two complementary lateral injector transistors. A cell is driven by read/write logic pulses applied to the word lines and bit lines only. To read the contents of a word from the array, read logic drives the read injectors of the cells constituting the word at a high injector current level and the read injectors of all other cells at a low injector current level. To select a word for writing, the read logic drives the read injectors of the cells comprising the word at a low injector current level and all other cells at a high injector current level. The contents of the selected word may then be changed by differentially driving the cell write injectors over the bit lines. Output multiplexing of cells storing corresponding bit positions in the words is achieved simply by connecting the cell outputs together (dot ANDing). Logical output discrimination and interfacing is achieved by comparing the multiplexed output current with a threshold current. If the output current is less than the threshold current, the cell is storing a logical ONE. If the output current is greater than the threshold current, the cell is storing a logical ZERO.

10 Claims, 13 Drawing Figures

MTL STORAGE CELL WITH INHERENT OUTPUT MULTIPLEX CAPABILITY

DESCRIPTION

1. Technical Field

The invention relates to semiconductor integrated storage circuitry constituting a two-dimensional word-organized matrix array of memory cells, each of which is formed from two cross-coupled merged transistor logic gates.

2. Background Art

Considerable progress has been made over the last decade in the field of logical circuits using bipolar transistors resulting in major improvements which, under the term MTL (Merged Transistor Logic) or I$^2$L (Integrated Injection Logic) have become widely publicized in technical literature. Attention is drawn, for example, to articles in the IEEE Journal of Solid State Circuits, Vol. SC-7, No. 5, Oct., 1972, pp 340ff and 346ff and to relevant patent literature such as UK Patent Specification No. 1284257.

The injection logic concept is essentially based on inverting single-or multiple-collector transistors which are powered by direct minority carrier injection inside the semiconductor body close to their emitter-base junctions (order of magnitude one diffusion length). This bipolar logic concept has very short switching times. In addition, it is suitable for the manufacture of extremely highly integrated large-scale logical circuits.

In the aforementioned UK Patent Specification, for example, the emitter and collector zones of a lateral transistor structure are arranged, suitably spaced from each other, in a semiconductor base material of a first conductivity type. The collector zone of the lateral transistor structure is provided with at least one further zone of the opposite conductivity type to serve as a collector (or emitter) zone of an inversely operated vertical transistor structure. The collector zone of the lateral transistor structure simultaneously forms the base zone of the vertical transistor structure. The base zone of the lateral transistor and the emitter (or collector) zone of the inversely operated vertical transistor structure are formed by the semiconductor base material of the first conductivity type. In order to operate this semiconductor structure as a basic logic circuit, a current is impressed into the emitter zone of the lateral transistor structure. This current serves as input current to the base zone of the vertical transistor and controls its output signal current. By merging the indentically doped zones connected to the same potential, a structure is obtained offering an optimum degree of integration and requiring, in the implementation considered, only two diffusion processes.

The inverting logical gates described are not only outstandingly suitable for the manufacture of more complex logical circuits but they can also be advantageously used as components for monolithic integrated storage cells. The cells are arranged in the form of an array so that each cell can be addressed via suitable selection means. Each cell consists of two basic logical gates which are symmetrically designed so that the output of one gate is connected to the input of the other so as to provide the necessary feedback condition of a cross-coupled flip-flop.

UK Patent Specification No. 1,374,058 discloses such a cross-coupled storage cell formed from two MTL gates. In this example, the collector of the inverting transistor of each respective gate is connected to the base of the inverting transistor in the other gate of the pair. The complementary transistor of each gate serves as a load element for the two flip-flop transistors. These complementary transistors provide the minority carrier injection for the gate and are connected in common to a first address line. The base of each flip-flop is further connected to the emitter of an associated one of two additional complementary addressing transistors, also integrated as lateral transistor structures, and each having its collector connected to an individual one of a pair of bit lines. The bases of the two additional complementary transistors and the emitters of the inverting flip-flop transistors are connected in common to a second address line.

In the standby state, the arrangement is such that the supply current maintains one of the two cross-coupled transistors of the cell conducting, representing a particular binary value. In a read operations, a selected cell is primed by raising the voltage on the first address line and simultaneously lowering the voltage on the second address line. This causes the associated additional complementary transistor to become conductive, which state may be detected by differential sensing of the bit lines. In a write operation, the cell is primed as for read and a differential current impressed on the bit lines. Current applied in this way causes the complementary transistor to operate inversely, injecting current into the base of the associated flip-flop transistor thereby setting its state. The cell is latched up in this state by restoring the original voltages on the first and second address lines.

UK Patent Specification No. 1,569,800 discloses a storage cell with two inverting transistors cross-coupled to form a flip-flop with the collector of one connected to the base of the other. A lateral complementary transistor structure is provided for each inverting transistor extending between the base of the associated inverting transistor and one bit line conductor of a bit line pair. The emitters of the inverting transistors are connected in common to a word line conductor. A word-organized array of cells is provided with the pairs of bit lines connected to corresponding cells in the column direction and the word lines connected to corresponding cells in the row direction.

In the standby state all word address lines have the same potential, for example, 0.5 volt. The two bit lines in each pair of bit lines are each connected to a potential about 0.7 volt higher than that of the word address lines. The potential of the bit lines of a cell is controlled so that the same current flows in the two lateral transistors of the cell which function as injectors and provide the load transistors for the cell.

In order to address a cell, the word address line is lowered to, for example, 0 volt. A read operation consists in impressing the same potential onto both bit lines of the pair associated with that cell so that the two injecting and load transistors carry the same current. This current is preferably chosen higher than that in the standby condition in order to achieve higher speed. The non-selected cells connected to the same bit line pair are practically cut-off from the power supply during this process, since the emitter-base voltage of the load transistors is several hundred millivolts lower than the emitter-base voltage of the flip-flop transistors of the selected word address line. However, in comparison with the read time, the information of the non-selected storage cells is maintained for a long time by the stored load in the flip-flop transistor capacitances. The effect of interrogation in this manner is to cause the lateral structure connected to the conducting transistor of the flip-flop to re-inject current into the associated bit line to which it is connected. The current difference in the bit line pair representing the storage state of the cell is measured by means of a sensing circuit in the form of a low-resistivity amplifier.

A write operation is achieved by lowering the associated word address line voltage and applying a current to one or other of the associated bit line pair. This results in a large part of the current being injected through the lateral structure into the associated transistor of the flip-flop setting it in a conducting state.

UK Patent No. 1,480,138 discloses an array of storage cells formed from two cross-coupled MTL gates each comprising one vertical inverting base transistor and two complementary injector transistors. Two of the injector transistors (one from each gate of a cell) operate as loads for the associated inverting transistor and are connected to associated row select lines extending across the array. Each of the other two injectors are individually connected to pairs of bit lines extending across the array in the column direction. Each cell in the array is supplied with a share of a quiescent current from a source.

In order to read a selected cell, the row select lines are energized to cause the elected cell to operate at a high current level with all the remaining cells operating at a low current level. As a result, substantially all the source current flows into the selected cell. Interrogation circuits in the form of sense amplifiers with logically complementing inputs connected to the bit lines, sense the relatively large currents in the bit lines from a selected cell and ascertain its logical state.

To write a cell, the row select lines are energized to ensure that the selected cell operates at a low current level whereas the remainder operate at a high current level. Voltages are then impressed using the same sense amplifier arrangement via the bit lines to the selected cell, to charge its state.

The above patents are representative of the state of the art pertaining to the use of MTL/I²L logic gates cross-coupled as storage cells. As previously stated, these MTL/I²L technologies can be utilized to produce densely packed circuits. Equally important as the development of cell structures capable of high density integration is the development of associated output circuits for sampling the logical states of the cells and directing this information to user circuits. Such circuits in the past have presented the circuit designer with considerable logistical difficulties in providing the appropriate interconnecting metallizations.

DISCLOSURE OF THE INVENTION

A merged transistor logic MTL storage cell has been developed with a mode of operation that provides it with an inherent output multiplex capability which eliminates such multiplexing and selection circuitry required by the prior art and considerably simplifies the connection problem. The selected mode of operation requires the cell read injectors to be switched between high and low current levels by combined read/write logic which controls the current supplied during both read and write modes. Output multiplexing of corresponding cells in an array of cells is achieved simply by connecting together the outputs of the corresponding cells. The need for multiplexors and their attached control logic is eliminated.

Logical output discrimination and interfacing of multiplexed MTL output is achieved by comparing the output current against a threshold current. If the output current is less than the threshold current the output is regarded as being a logical ONE. If the output current is greater than the threshold current then the output is regarded as being a logical ZERO. Logical output discrimination and interfacing of multiplexed MTL output has been achieved in the preferred embodiment by means of a small and simple MTL device having one injector, one base and no collectors. However, any means of converting the output current to a voltage, and sensing that voltage, may be used.

In order that the invention may be fully understood, a description of the best mode will now be made with reference to the accompanying drawings.

BRIEF DESCRIPTION OF THE DRAWINGS

FIG. 1b is a sectional view taken along line A—13 A of FIG. 1a;

FIG. 12 shows an equivalent circuit of an interface device forming part of the discriminating circuit shown in FIG. 11; and .

DEVELOPMENT CONSIDERATIONS

The introduction of large scale integration (LSI) in the circuit design field has generated the problem of balancing the advantages of batch fabricating manufacture techniques against the requirements of both the circuits (or functional building blocks of circuits) and the systems using the circuits. It is now a recognized aim for manufacturers of computer equipment to use as few LSI packages as possible, preferably with each package being of the same type in order to reduce cost and simplify the manufacturing process. Efficient utilization of LSI package space is important in terms of both the component layout and the interconnection of the components at the system level.

Figure 1A:
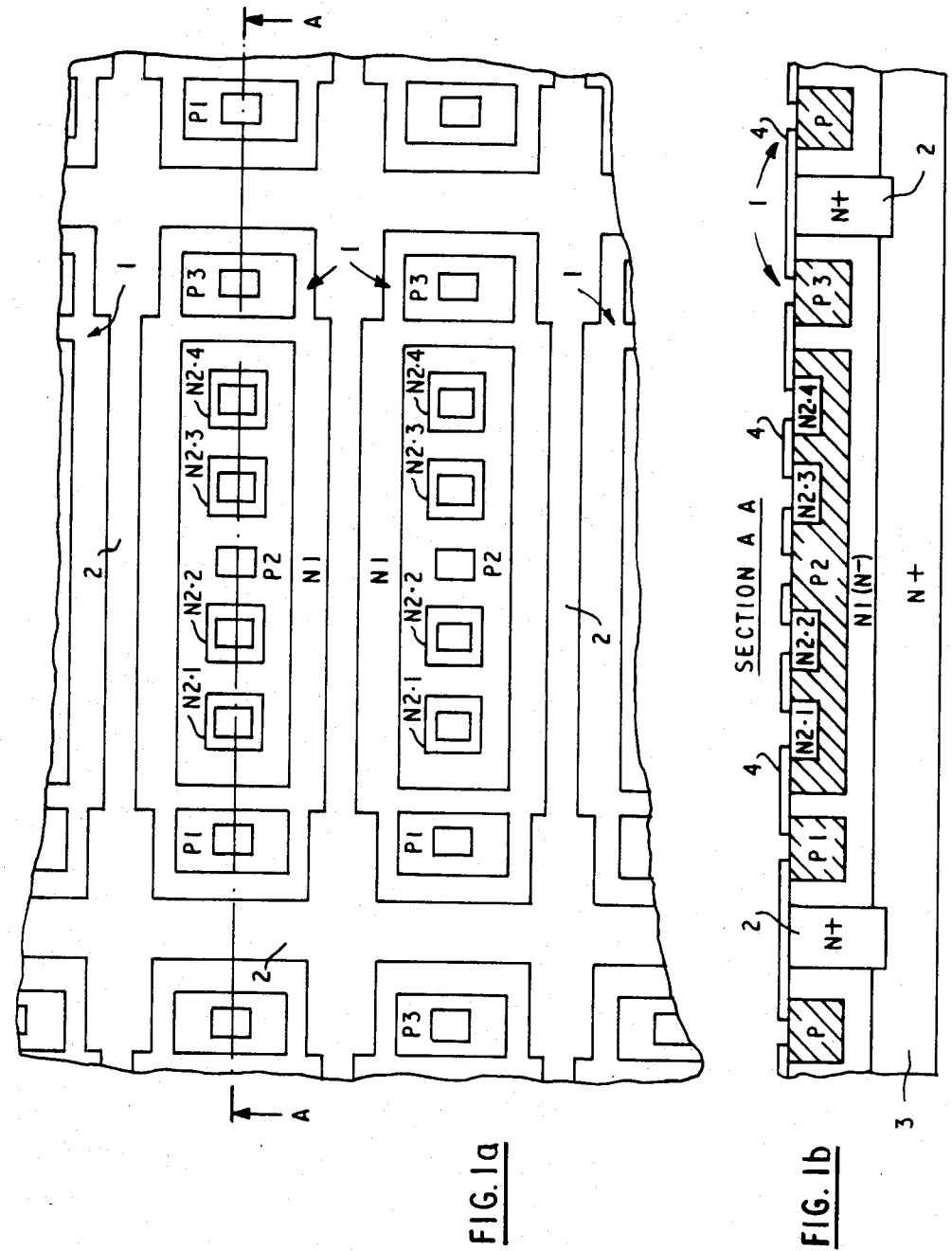
FIG. 1a shows a structured layout of a portion of a master-slice MTL integrated circuit to which the present invention may be applied.
Figure 1B:
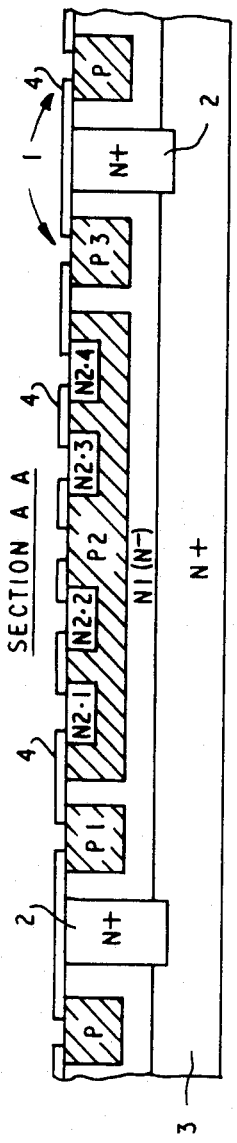

In the so-called "master slice" approach to LSI design, the same fabricating masks are used for the manufacturing process steps such as diffusion and insulation for a given component layout, while different metallization masks are used to interconnect the available components to provide the circuit function required by a given application. FIGS. 1a and 1b show a portion of a "master slice" LSI in which the circuit components are organized into an array of identical component cells 1 bounded by given application. FIGS. 1a and 1b show a portion of a "master slice" LSI in which the circuit components are organized into an array of identical component cells 1 bounded by isolation regions 2. The cross-sectional view along the line A—A shows the structural details of one of the cells.

A layer 3 of highly doped N+ type material provides the substrate for the LSI structure. Usually, this layer supported on a further layer of P type material (not shown) which, together with a surrounding border of highly doped P+ type material provides the isolation region for this particular section of the master-slice. The main body of each cell 1 is provided by a layer N1 of N-type material epitaxilly grown on the N+ substrate 3. Regions P1, P2 and P3 of P type material are diffused into the layer N1 and four regions N2.1, N2.2, N2.3, and N2.4 of N+ type material are diffused into the central P type region P2. A diffusion of highly-doped N+ type material through the body of the cell into the underlying substrate 3 provides the "ladder like" isolation structure 2 effectively isolating one cell from its neighbors.

This structure provides two semiconductor sequences P1/N1/P2 and P3/N1/P2 of two lateral transistors merged with a central multi-electrode vertical transistor N2/P2/N1. A silicon dioxide protection layer 4 overlays the surface of the LSI and is provided (in the usual manner) with apertures through which connections can be made to the three P type diffusions P1, P2 and P3 and four N-type diffusions N2.1, N2.2, N2.3 and N2.4.

Figure 2:
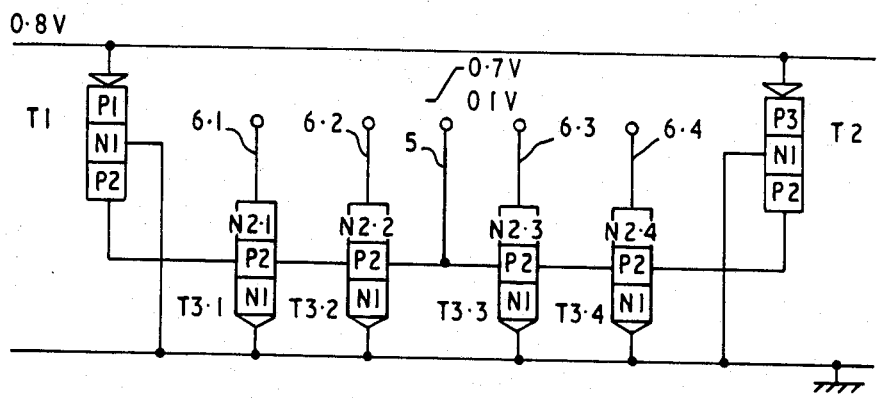
FIG. 2 shows an equivalent circuit of an MTL gate formed from the integrated circuit structure of FIGS. 1a and 1b.

The equivalent circuit of the basic cell 1 is shown in FIG. 2 with the appropriate potentials applied so that it functions as a merged transistor having four output gates. In this configuration, the two lateral injector PNP transistors T1 and T2 supply a four collector vertical inverting NPN multiple transistor, represented for simplicity in FIG. 2 as four individual transistors T3.1, T3.2, T3.3 and T3.4. The input to the gate (which may be taken directly from the output of an identical preceding gate) is applied via input conductor 5. The outputs are taken from the four collector electrodes of the inverting multiple transistor via output conductors 6.1, 6.2, 6.3 and 6.4.

In operation, a short circuit at the input conductor 5 (0.1 volts from a preceding gate with its output low) causes the injector current I from the injector transistors T1 and T2 to flow to ground. The multiple electrode inverting transistor T3 consequently remains off and the potential on the output conductors (assuming they are connected to appropriate loads) remain high (0.7 volts if connected as input to a succeeding gate). An open circuit at the input terminal 5 (0.7 volts from a preceding gate with its output high) diverts the injector current I into the base regions of the inverter transistor T3. This causes T3 to conduct, such that the potential on the output conductors drops to the low level (0.1 volts if the loads are provided by further identical logical gates).

Figure 3:
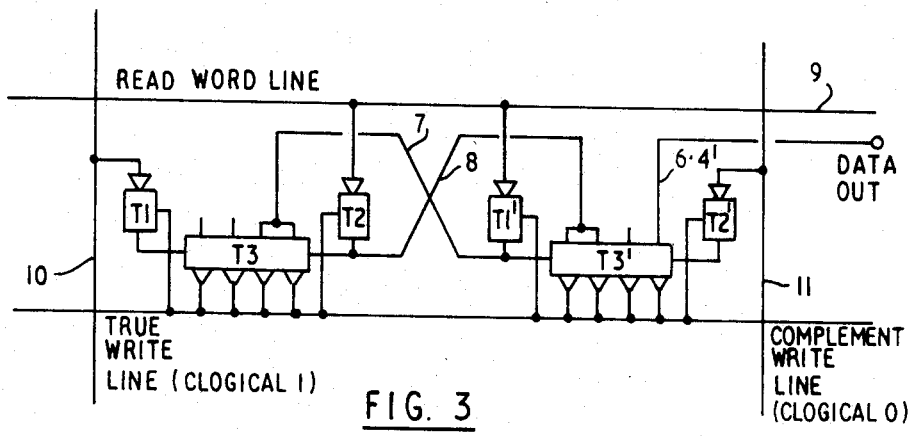
FIG. 3 shows a storage cell used in the present invention, constructed from two MTL gates each as shown in FIG. 2.

FIG. 3 shows the equivalent circuit of a storage cell consisting of two cross-coupled dual injector four collector MTL gates, each as shown in FIG. 2. The bistable nature of the storage cell is achieved by cross-coupling (by means of conductors 7 and 8) the output of each gate to the input of the other in conventional fashion. In view of the low $\beta$ of the inverter transistors T3 and T3A, the output from each gate is taken from two collectors of the multiple electrode inverting transistors T3 and T3A, thus ensuring that the loop gain of the cell is greater than unity. An important modification made to the basic gate arrangement shown in FIG. 2 is that the two injector transistors for each gate are driven from separate supplies. These separate supplies can be used to control the operations of the storage cell as will be described in more detail hereinafter.

More specifically, with reference to FIG. 3, a first address line 9 is connected to the emitter electrodes of injector transistors T2 and T1A, respectively. The transistors T2 and T1A are referred to hereinafter as the read injectors. Each of the second address lines 10 and 11 is individually connected to one of the other two injector transistors T1 or T2A, respectively, forming the storage cell. The transistors T1 and T2A are referred to hereinafter as the true and complement write injectors, respectively. Thus, the second or true address line 10 is connected to the true write injector transistor T1 of the gate, and the second or complement address line 11 is connected to the complement write injector transistor T2A of the other gate. Both common emitters of the inverting transistors and bases of the injector transistors are connected to a reference voltage, which in this case is ground potential.

Figure 4:
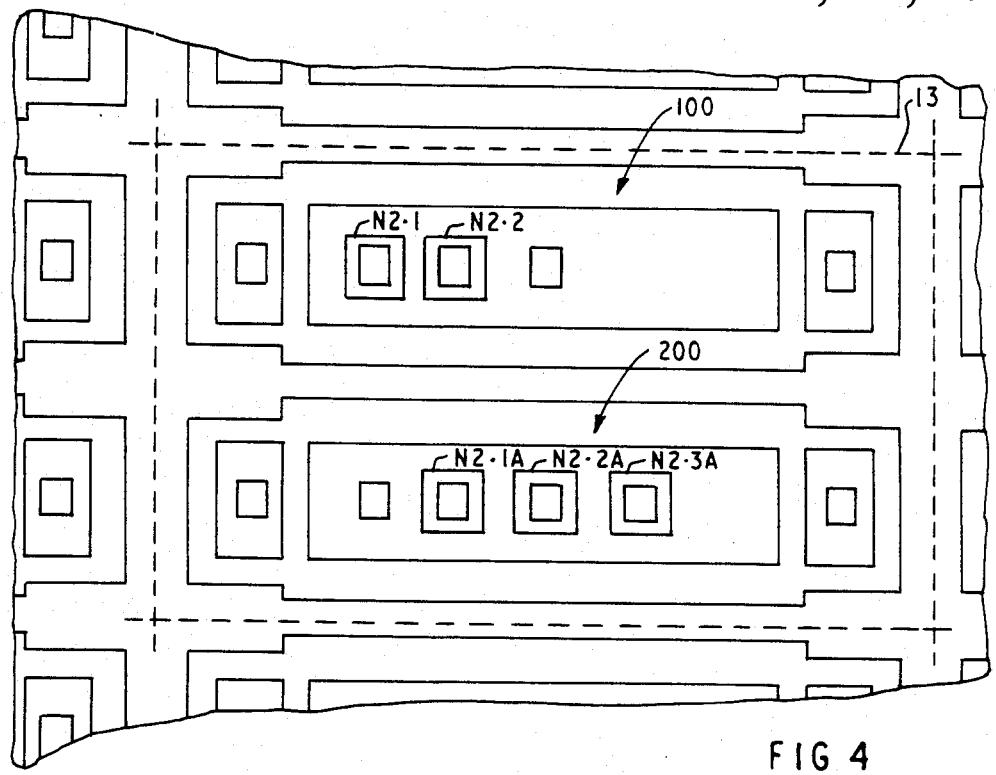
FIG. 4 shows a modified structural layout of the MTL master-slice shown in FIGS. 1a and 1b to simplify the metallizations interconnecting the circuit components.
Figure 5:
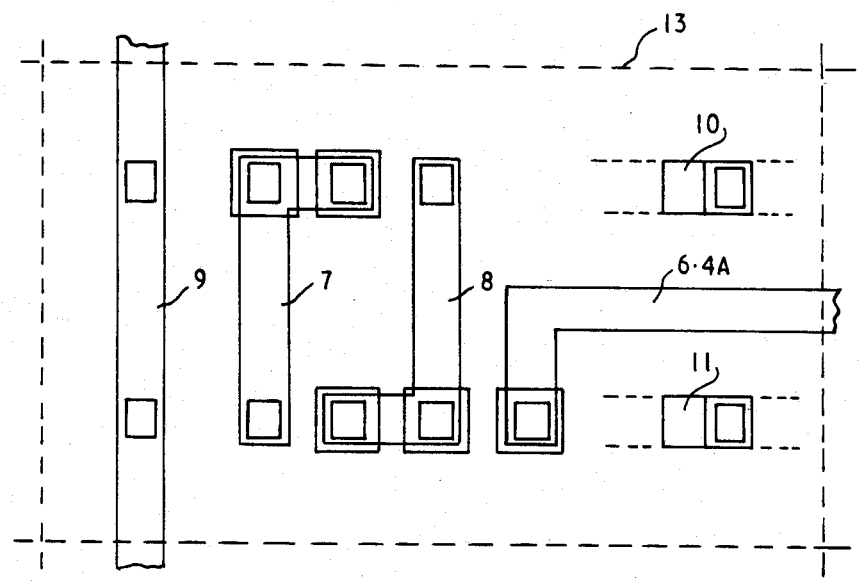
FIG. 5 shows the pattern of metallizations for the modified cell shown in FIG. 4.

A practical realization of the storage-cell shown schematically in FIG. 3 is shown in FIGS. 4 and 5. FIG. 4 shows a modified layout of the master-slice LSI (as shown in FIGS. 1a and 1b which aids the interconnection of the circuit components. FIG. 5 shows the pattern of metallizations used to interconnect the components shown in FIG. 4 to form a storage cell in accordance with the invention.

The main modification to the master-slice layout shown in FIGS. 1a and 1b the rearrangement of the structure of one gate in each storage cell to enable cross-coupling to be achieved without the conductors 7 and 8 actually having to cross over each other. Thus, in FIG. 4, a storage cell (shown bounded by box 13), is constructed from two gates 100 and 200. Since only two collectors of transistors T3 (see FIG. 3) are used in the circuit, a modified diffusion mask is used during the manufacturing process so that only two collectors N2.1 and N2.2 are produced in gate 100.

The modification to gate 200 involves repositioning the collectors and base connection of transistor T3A so that the position of the base aperture through the silicon dioxide layer of transistor T3A corresponds to that of the collector N2.1 aperture of transistor T3 of gate 100. Moreover, the position of the collector N2.2A aperture of transistor T3A must correspond to that of the base aperture of transistor T3 of gate 100. Further, since only three of the four collectors are used the diffusion mask is further modified so that only three collectors N2.1A, N2.2A and N2.3A are produced.

The metallization pattern for interconnecting the storage cell 13 is shown separately in FIG. 5. The cross-coupled conductors 7 and 8 are realized by separated (i.e., non-crossed) metallization. A first L-shaped metallization interconnects the base of transistor T3A to the collectors N2.1 and N2.2 of transistor T3, and a second L-shaped metallization interconnects the base of transistor T3 to the collectors N2.1A and N2.2A of transistor T3A. Output conductor 6.4A is provided as a further L-shaped metallization which is connected at one end to the collector N2.3A of transistor T3A. A metallization extending along one edge of the cell provides the read injector address line 9 which is common to the emitters of the read injector transistors T2 and T1A in each cell. Two further metallizations provide the true write injector address line 10 and complement write injector address line 11, which are connected to the emitters of true and complement write injector transistors T1 and T2A, respectively. Since these two conductors extend in a direction orthogonal to that of the read injector address line 9, they are transferred by means of via holes to a different integrated circuit level which is not visible in FIG. 4.

In one conventional mode of operation, a storage cell is maintained in its latched state by a voltage (0.7 volts) on the read injector address line 9 to hold the read injectors of the cell in a high current conducting state. At the same time, a reference voltage (0 volts) is applied to the true and complement write injector address lines 10 and 11 to hold the two write injectors T1 and T2A in the non-conducting state such that they have no influence on the cell in its standby condition.

In the convention selected, a storage cell is regarded as storing, a logical "ONE" when it is latched up with transistor T3 conducting and transistor T3A non-conducting whereby the twin collectors of transistor T3 sink the injected current of transistor T3A. The state of the cell is derived by sampling the voltage on output collector 6.4 A of transistor T3A. Thus, when the cell is in the binary ONE state, the output collector 6.4A of transistor T3A is unable to sink any current and its voltage is able to float high (assuming a suitable load is provided) at an up-level of 0.7 volts. Conversely, a storage cell is regarded as storing a binary "ZERO" when it is latched up with transistor T3A conducting and transistor T3 non-conducting. The output collector 6.4A of transistor T3A sinks the injected current of transistor T3 and (assuming a suitable load is provided) its voltage will be at a down-level of 0.1 volts.

Figure 6:
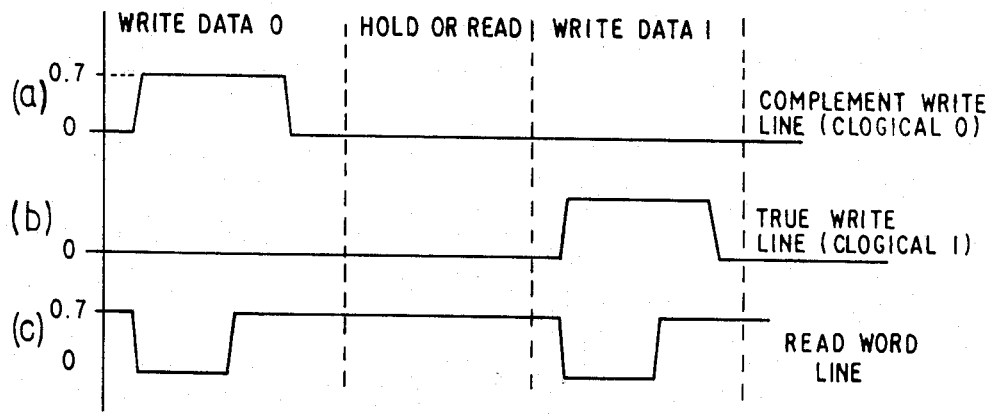
FIG. 6 shows voltage waveforms that would conventionally be applied to conductors in the circuit of FIG. 3 in order to read data from, or write data into, the storage cell of FIG. 3.

The logical state of a cell is set or written by turning off the read injectors and turning on one of the write injectors. A logical ONE state is set by turning on the true write injector T1 and a logical ZERO state is set by turning on the complement write injector T2A. The set state is maintained by turning the read injectors back on and then turning off the write injectors. For write protection, the read and write currents must be such that the state of a cell, with its read injectors conducting, will not be disturbed by either write injector (turning on and conducting). The write operation summarized above is illustrated with reference to the voltage waveform shown in FIG. 6. During a write operation, the voltage on the read address line 9 is reduced (0 volts), (waveform (c)), thus, effectively removing the injected supply from both gates forming the cell. While in this unselected state, a voltage (0.7 volts) is impressed on one or the other of the two write address lines, depending on the binary state to be stored (waveform (a) for write ONE, waveform (b) for write ZERO). In this manner, the provision of supply current to one gate sets the conductivity of the cell. Before the voltage on the selected second address line terminates, the voltage on the read address line is restored to its high value (0.7 volts) so that the cell is latched up in the selected binary state. With this arrangement, a permanent read-out of the cell is available on output collector 6.4A and the state of the cell may be interrogated at any time. It is to be noted that any one of a number of well known bit or word line drivers could be used to selectively control the voltages on the address lines. Furthermore, any one of a number of known voltage detectors can be used to monitor the voltage on output collector 6.4A.

In a word organized storage array, a plurality of such storage cells (each cell being constructed as in FIG. 3) is arranged into rows and columns in the usual manner. The cells in each row are linked together by a common word line extending across the array in the row direction and linking together the read injector address lines 9 for the cells in the row. Corresponding cells in the different rows are linked together by common bit lines extending in the column direction linking together the true and complement write injector address lines 10 and 11, respectively. In operation, a word is written into storage by selecting the word line associated with the appropriate row of storage cells, and concurrently applying in the usual manner an appropriate pattern of data write signals to the appropriate pair of data write lines. The permanent read-out feature of the cells operated in the manner referred to above is an advantage where the array is used for example to store digital convergence correction values for a raster scanned CRT, in which the values need to be read out in real time as the scanning electron beam passes from one zone to another over the CRT screen. Such a correction scheme is described and claimed in our U.S. Pat. No. 4,203,051.

In such an application where each digital correction value stored as a four bit word in the storage array is required to be read out one at a time in a successive sequence, a multiplexing arrangement is required to sample the contents of each word and to apply the four bits from each word in turn to a single group of four output conductors connected to the using circuits. In the case of the convergence correction application the four output bits are applied to digital-to-analogue converters to generate an equivalent analogue signal which is used to drive the convergence coils of the CRT thereby dynamically correcting the convergence error represented by the stored value for the zone of the screen being scanned.

Figure 7:
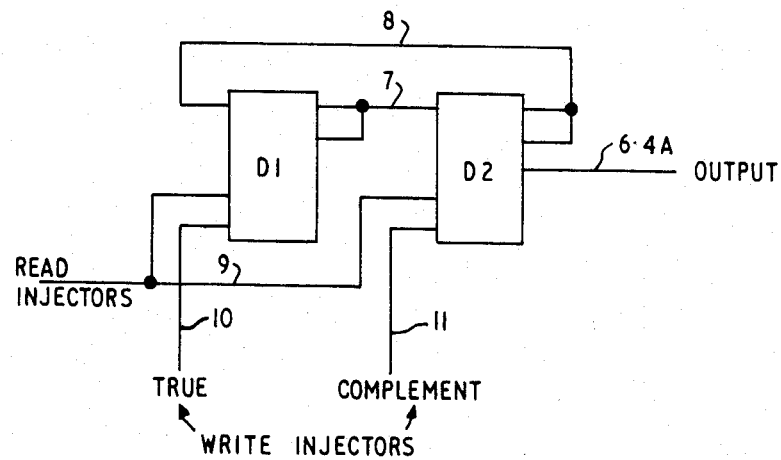
FIG. 7 shows the storage cell of FIG. 3 represented using standard MTL device symbols.

A word select and multiplexing arrangement will be described for a storage array of cells operating as described hereinbefore. In order to simplify the circuit diagram, the storage cells will be represented by standard MTL device symbols. Such symbols are shown in FIG. 7 which represents the two gate storage cell shown in FIG. 3. In the figure, the output gate is labelled as block D2 and the input gate as block D1. The convention used is that the base input for a device is shown connected to the top left of the block, the two injector inputs connected to the bottom left, and the collector outputs connected to the top right of the block. As seen in the representation and as required by the circuit in FIG. 3, the input gate D1 has two collectors whereas the output gate D2 has three. The interconnections between the blocks are referenced with the same numerals as used in the circuit schematic of FIG. 3.

Figure 8:
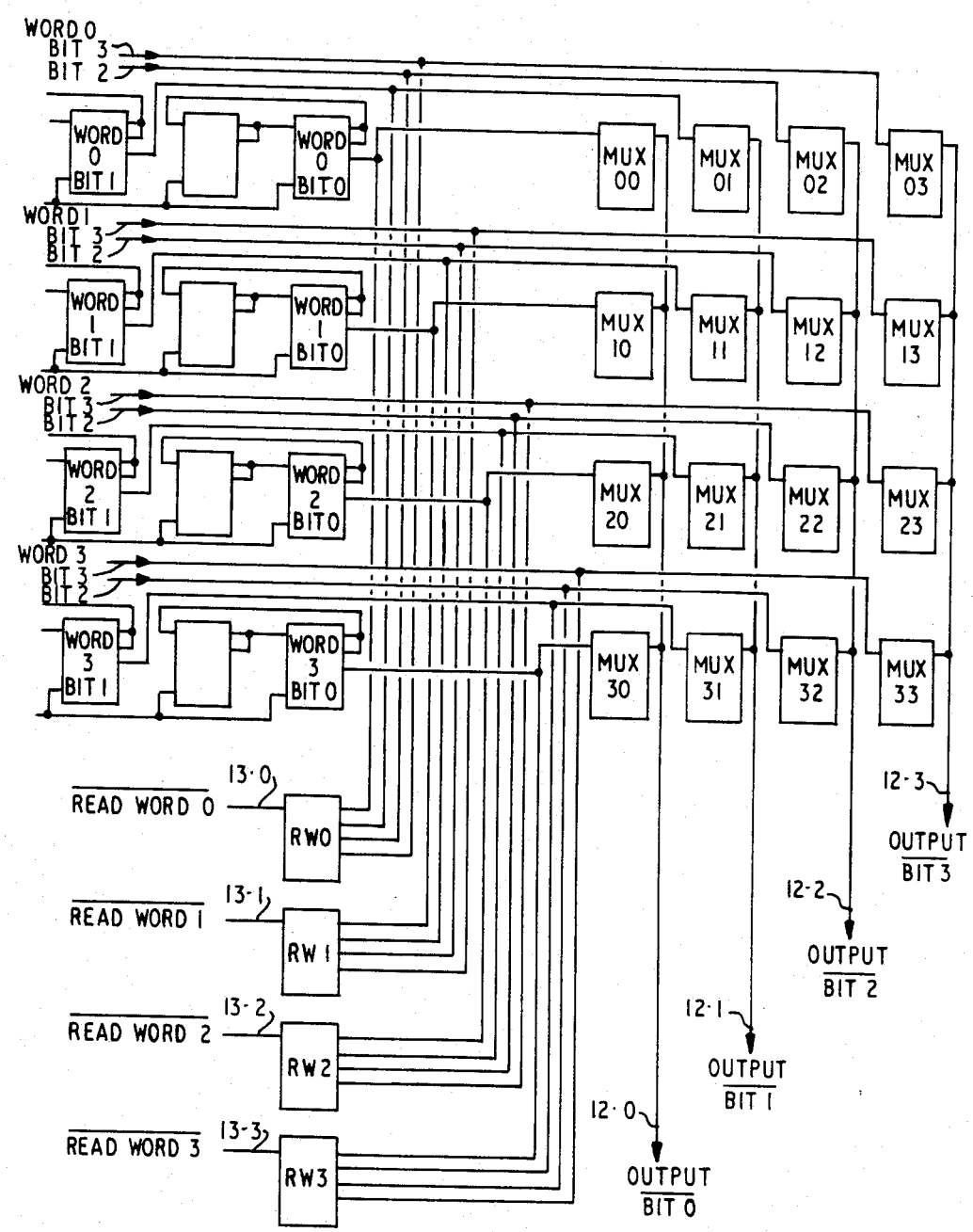
FIG. 8 shows a segment of a storage array composed of storage cells as in FIG. 3 and represented in FIG. 7 with attached conventional four way output multiplexor.

FIG. 8 uses this convention to show the multiplexing arrangements for the outputs from the storage array comprising a matrix of storage cells each as described above with reference to FIG. 3 and as represented in FIG. 7. The array is indicated as consisting of four words of four bits each for the purpose of illustration, although in practice for an application such a convergence correction there would in all probability be many more words than this. Since the storage array consists of a matrix of identical cells only a portion is shown in the figure. Also, for simplicity, the connections to the write injectors of the cells have been omitted. The output lines from each cell in a word are each connected to a corresponding one of four multiplex devices. Thus, the bit 0 output from word 0 is connected to the input of multiplexor MUX00, the bit 1 output from word 0 is connected to the input of multiplexor MUX01 and so on. Similarly the bit 0, 1, 2 and 3 of word 1 are, respectively, connected to the inputs of multiplexors MUX10, MUX11, MUX12 and MUX13. Each bit output is so connected to the input of an individual multiplexor right through the array to the last bit 3 or word 3 which is connected to the input of multiplexor MUX33. The outputs from each multiplexor connected to a corresponding bit position in a word are connected together to a common output conductor. Thus, the bit 0 output multiplexors MUX00 to MUX30 are connected to the output line 12.0; the bit 1 output multiplexors MUX01 to MUX31 to the output line 12.1; and so on with similar connections to output lines 12.2 and 12.3.

Each output multiplexor is itself an MTL gate similar to that shown in FIG. 2 but with a single collector output. For simplicity the connections to the multiplexor injectors have been omitted from the diagram. The collector output from a storage cell is connected to the base connection of its associated output multiplexor which operates as an inverter in the manner hereinbefore explained.

Selection of a word to be read out from the storage array is by means of read word selectors RW0 to RW3, one of which is provided for each word in the array. Each word selector is itself an MTL gate, this time with four output collectors, each of which is connected to one of the four output bit lines from the associated word in the array. Thus, the output collectors of word selector RW0 are individually connected to the four output lines from word 0. Similar connections are made from the outputs of selectors RW1, RW2 and RW3 to the output bit lines of words 1, 2 and 3, respectively. Selection of a word for read out is achieved by an appropriate signal to the base input of the associated selector.

In order to understand the operation of the multiplexing circuits it should be remembered that the output gate of a storage cell in this mode of operation is either non-conducting with the collector at its upper voltage level (0.7 volts) storing a binary ONE or conducting with the output collector at its lower voltage level (0.1 volts) storing a binary ZERO. In order to select a word, the associated read selector is made non-conducting and all other selectors are made conducting by appropriate level signals on the respective base inputs 13.0 to 13.3. In view of the inverting nature of an MTL gate, an up-level signal on its base puts it into the conducting state and a down-level signal puts it in a non-conducting state. Since a read select device in a conducting state is pulling any current on the bit lines from its associated word, thereby isolating the outputs from the multiplexors, an up-level signal on a base input to a read selector represents the "not-select" state for that word. Conversely, a down-level signal to a read selector puts it in a non-conducting state so that it is not pulling any current and the output states of the bit lines of the associated word are transmitted to the output multiplexors. A down-level signal on a base input to a read selector represents the "select" state for that word. Accordingly the inputs 13.0, 13.1, 13.2 and 13.3 to the read selectors RW0, RW1, RW2 and RW3 are labelled $\overline{\text{READ WORD 0}}$, $\overline{\text{READ WORD 1}}$, $\overline{\text{READ WORD 2}}$ AND $\overline{\text{READ WORD 3}}$, respectively.

In order, for example, to present word 2 data at the outputs, READ WORD 2 is selected by a low voltage (logical ZERO) applied to $\overline{\text{READ WORD 2}}$ input 13.2 or RW2 while the other inputs 13.0, 13.1 and 13.3 are held at a high voltage (logical ONE). Only the output bits from word 2 are applied to their associated multiplexors MUX20–MUX23. MUX23. If any bit of the selected word is storing a binary ONE then due to the inverting nature of the multiplexor to which is applied the multiplexor gate will be put into a conducting state (low level voltage condition) so that its output line is pulling current.

The up-level voltage from a non-conducting multiplexor is interpreted as meaning that the associated cell is storing a binary ZERO whereas the down-level from a multiplexor pulling current in interpreted as meaning that the cell is storing a binary ONE. The multiplexor output lines 12.0 to 12.3 have been labelled OUTPUT $\overline{\text{BIT0}}$, OUTPUT $\overline{\text{BIT1}}$, OUTPUT $\overline{\text{BIT2}}$, and OUTPUT $\overline{\text{BIT3}}$ respectively. In summary therefore, if OUTPUT $\overline{\text{BITx}}$ sinks current, then $\overline{\text{BITx}}$ is interpreted as being at logical ZERO and hence BITx is interprereted as being at logical ONE. Conversely, if OUTPUT $\overline{\text{BITx}}$ does not sink current then BITx is interpreted as being at logical ZERO.

It is seen from the foregoing that the multiplexing arrangement necessary for a storage array of cells operating as described is very wasteful of on-chip space since an individual multiplex device MUX is required for each bit of each word of the array and additionally a word selector is required for each word of the array. Furthermore, the interconnection of the storage cells, selectors and multiplexors provides a considerable wiring problem.

BEST MODE FOR CARRYING OUT THE INVENTION

In order to overcome these difficulties, a more sophisticated method of controlling the storage cells has been devised which not only writes the data in the cells but also provides an output multiplex capability without the need for output multiplexors and their attached control logic. The storage cell is identical to that shown in the circuit schematic of FIG. 3 and as structure layout in FIG. 4 and FIG. 5. The essential difference is that the word or read line injectors are never turned off, but are switched between high current $I_H$ and low current $I_L$ levels by combined read/write logic (not shown).

The high and low current levels are both sufficient to maintain a cell in its latched state with both write injectors turned off. The state of a cell with its read injectors at the high current level will not be disturbed by either write injector turning on, a condition that occurs when a word connected to the same bit lines is being written. The state of a cell is set by having the read injectors at the low current level and turning on one or the other of the write injectors with a medium value current $I_M$/injector. As in the previous example of operation of the cell, a TRUE write injector is turned on in order to set a logical ONE and a COMPLEMENT write injector to set a logical ZERO. In practice the write lines are generated in a complentary fashion. The TRUE and COMPLEMENT lines are never turned on together. The read injector currents are controlled in both read and write operations of the storage cell.

In read operation, when no data is applied at the write injectors, there are three possible output current levels (high, low and zero) as opposed to the two current levels (high and zero) available from the storage cell when operated in the first mode described hereinbefore. The high output current level is obtained when a logical ZERO is stored and the read injector current level is high. The low output current level is obtained when a logical ZERO is stored and the read injector current level is low. The zero output current level is obtained when a logical ONE is stored whether the read injector current is high or low. These three output current levels form the basis of the inherent output multiplex capability.

In order to multiplex the outputs of a number of words in a storage array, it is sufficient with cells operated according to the second mode described hereinbefore, to wire together tte output collectors of corresponding bits in each word. In this way the need for output multiplexors and the attached word read select logic is eliminated.

Figure 9:
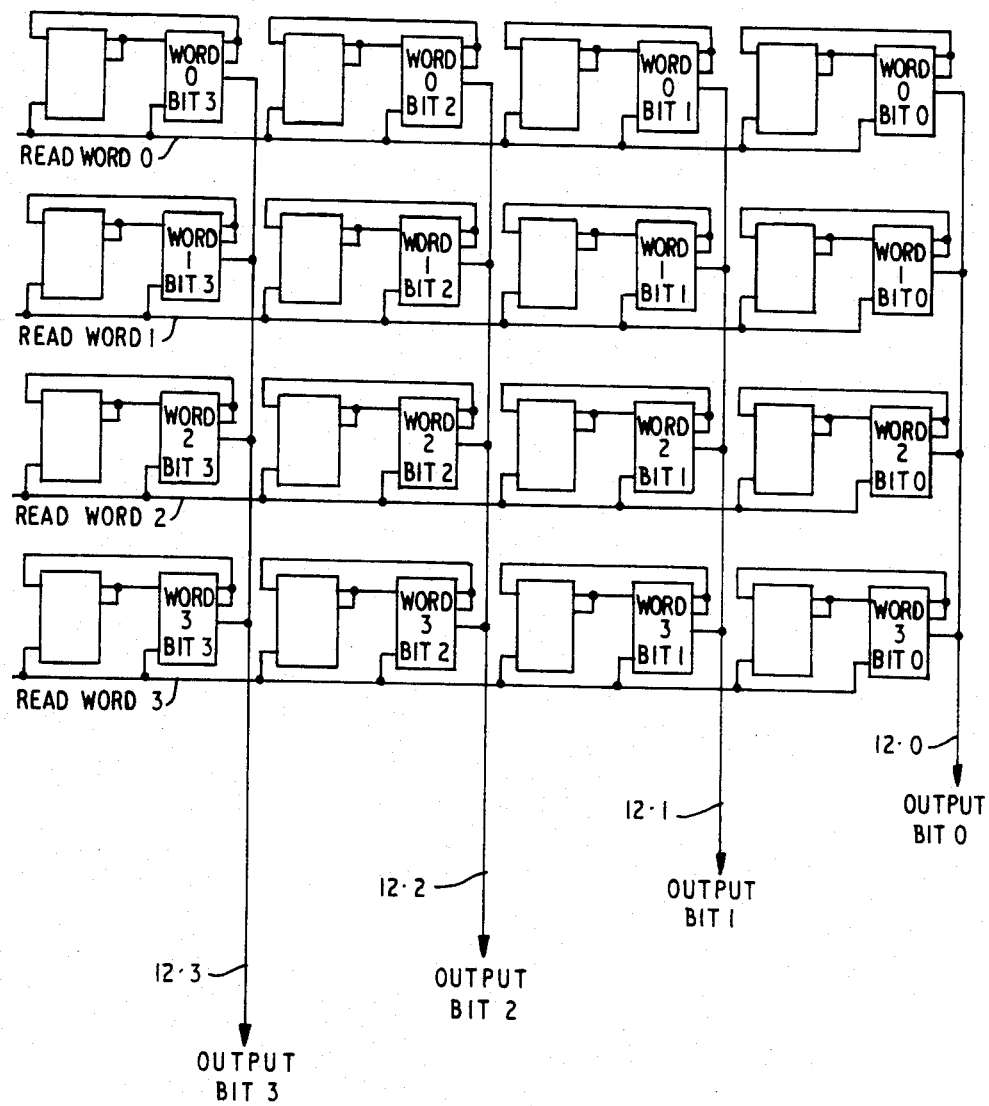
FIG. 9 shows a segment of a storage array composed of storage cells as in FIG. 3 and represented in FIG. 7 with inherent output multiplexing according to the invention.

FIG. 9 shows a segment of a storage array with inherent multiplexing according to the invention. In this case the four multiplex output lines 12.0 to 12.3 are directly connected to all the corresponding cells storing the 0 bits, 1 bits, 2 bits and 3 bits, respectively, of all the words. In order to select a word for read out to the output lines, the read injector line for that word is driven with a high current level while the read injector lines for the remaining words are at the low current level. Now if any output bit line 12.0 to 12.3 sinks a large current then the bit stored by the associated cell of the selected word is interpreted as representing a logical ZERO. Conversely, if any output bit line sinks a small or zero current then the bit stored by the associated cell of the selected word is interpreted as representing a logical ONE. Any small current produced is the result of the low currents from any cells storing binary ZERO's from unselected words on the same bit line. The arrangement is such that the sum of the collector currents from words at the low current level is sufficiently small not to affect the interpretation of the word at the high current level.

The read/write operations of the storage cell are summarized in the following table:

| LINE CURRENT PER INJECTOR | | | |
|---|---|---|---|
| WORD READ | TRUE | COMPLEMENT | STORAGE CELL STATUS |
| $I_H$ | 0 | 0 | READ MODE. DATA MAINTAINED AND READABLE |
| $I_H$ | 0 | $I_M$ | READ MODE. DATA MAINTAINED AND READABLE |
| $I_H$ | $I_M$ | 0 | READ MODE. DATA MAINTAINED AND READABLE |
| $I_L$ | 0 | 0 | NOT-READ MODE. DATA MAINTAINED BUT UNREADABLE |
| $I_L$ | 0 | $I_M$ | NOT-READ MODE. LOGICAL 0 WRITTEN |
| $I_L$ | $I_M$ | 0 | NOT-READ MODE. LOGICAL 1 WRITTEN |

To determine the relationships between the injector currents $I_H$, $I_M$ and $I_L$, the following must be considered:

1. In the read mode, $I_H$ must be sufficiently large to prevent the storage cell latch changing state in response to complementary data applied at the write injectors of the cell.
2. In the not-read mode, $I_L$ must be small enough to allow the latch to change state in response to complementary data applied at the TRUE and COMPLEMENT write injectors of the cell. $I_L$ must also be sufficiently large to maintain the data when the cell is not being written.

For an MTL device, the effective gain ($\beta'$) is generally defined as the ratio of the current in a given unsaturated collector to the current injected, i.e., $\beta' = I_C/I_{INJ}$, which may be written as $I_c = \beta' I_{INJ}$.

$\beta'$ is a function of injector current, collector size and distance from the injector. $\beta'$ is generally low, but is greater than unity for the normal operating range of injector current.

Consider a storage cell set to a logical ZERO in read mode with its output drawing current ($I_{OUT}=\beta' I_H$) with its output gate (D2 in FIG. 7) on and holding the other gate (D1 in FIG. 7) off. The twin collectors of gate D2 are able to sink all the injected current in gate D1. Therefore, $2\beta' I_{INJ}(D2) > I_{INJ}(D1)$. Thus, for a cell in read mode in which $I_{INJ}=I_H$, $2\beta' I_H > I_H$. If a medium current $I_M$ is now applied to the write injector of gate D1 (Logical 1 applied) then $I_{INJ}(D1)=I_H+I_M$. To prevent the latch changing state the following condition must be met:

$$2\beta' I_{INJ}(D2) > I_H = I_M$$

and, thus, for a selected storage cell $2\beta' I_H > I_H + I_M$.

The same relationship applies for a storage cell set to a logical ONE in read mode with its output drawing no current ($I_{OUT}=0$). The output gate D2 is held off by gate D1 which is conducting hard. The twin collectors of gate D1 are able to sink all the injected current in gate D2, with and without $I_M$ applied to the write injector of gate D2 (Logical 0 applied).

Consider a storage cell set to a logical ZERO in not-read mode with its output drawing current ($I_{OUT}=\beta' I_L$). With the write injector currents at ZERO, the output gate D2 is on and holds the other gate D1 off. The twin collectors of gate D2 are able to sink all the injected current in gate D1. Thus, $2\beta' I_{INJ}(D2) > I_{INJ}(D1)$ which for a non-selected cell may be written $2\beta' I_L > I_L$.

Accordingly with the write injector currents at ZERO and the read injector currents at $I_L$ the latch state and hence the stored data is maintained at logical 0. If a medium current $I_M$ is now applied to the write injector of gate D1 (logical 1 applied), then $I_{INJ}$ (D1)=$I_L+I_M$. For the latch to change state, the twin collectors of D2 must no longer be able to sink all the injected current in D1. That is, $2\beta' I_{INJ}$ (D2)<$I_{INJ}$, (D1) which for the unselected cell becomes $2\beta' I_L<I_L+I_M$.

If this is the case, the latch will change state with the output becoming logical 1 ($I_{OUT}=0$) in response to the applied data. If the write injector currents are again at zero, the new data will be maintained by $I_L$ injected into the read injectors. The same relationship can be developed for the cell with the output at logical 1.

In the cases where the applied data is the same as the state of the latch, then the latch state is simply reinforced.

To summarize:

$$2\beta' I_H>I_H+I_M \text{ and } 2\beta' I_L<I_L+I_M (2\beta'-1) I_H22$$
$$I_M>(2\beta'-1) I_L>0,$$

for a range of $\beta'$ values such that:

$$\beta'_{MAX} \geq \beta' \geq \beta'_{MIN}$$

The relationships can be fully expressed as:

$$(2\beta'_{MIN}-1) I_H>I_M>(2\beta'_{MAX}-1) I_L>0$$

and clearly $\beta_{MIN}>0.5$.

The above relationships hold for a cell using twin collectors in the cross-coupled latch. If single collectors were used in their place, then the relationships would be as follows:

$$(\beta'_{MIN}-1) I_H>I_M>(\beta'_{MAX}-1) I_L>0$$

and clearly $\beta'_{MIN}>1$ for a single collector cross-coupled latch.

In order to discriminate between the output currents from a cell storing a binary ONE or a binary ZERO the output current $I_{OUT}$ from the cell is compared with a threshold current $I_{TH}$.

If $I_{OUT}>I_{TH}$, then the cell is storing a logical ZERO.

If $I_{OUT}>I_{TH}$, then the cell is storing a logical ONE.

Figure 10:
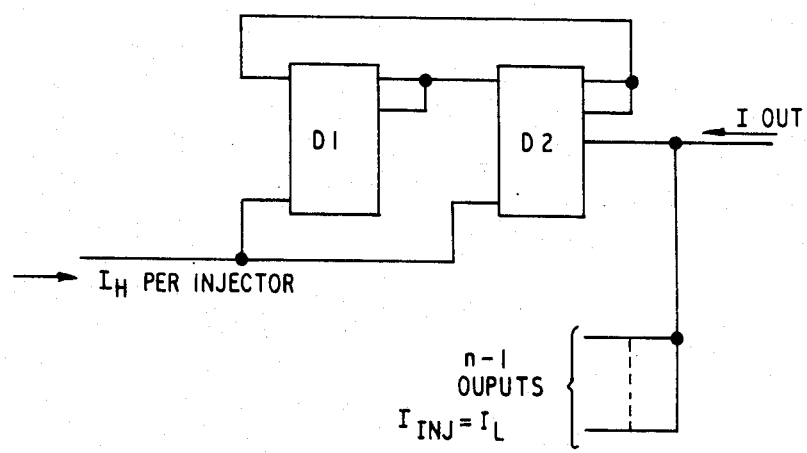
FIG. 10 shows a single storage cell with n-way multiplexing at its output.

Consider now n-way multiplexing at the output of a given bit as shown in FIG. 10.

The word to be read is at the high current level ($I_H$ per injector) and the other n−1 words are at the low current level ($I_L$ per injector). The output of a bit, with the word at the high current level, is zero if the bit is set to logical 1 and is $\beta'I_H$ if the bit is set to logical 0. The output of a bit, with the word at the low current level, is zero if the bit is set to logical 1 and is $\beta'I_L$ if the bit is set to logical 0.

The current summed at the output by the multiplexing function is therefore:

$I_{OUT}=m\beta'I_L$, when the bit of the high current word is set to logical 1, $I_{OUT}=\beta'I_H+m\beta'I_L$ when the bit of the high current word is set to logical 0, m being any integer from 0 to n−1 (n−1≧m≧0).

Therefore, in order for a bit to be correctly read:

$$\beta'I_H+m\beta'I_L \geq \beta'I_H>I_{TH}>(N-1)\beta'I_L \geq m\beta'I_L>0.$$

Thus, the threshold current $I_{TH}$ must satisfy the following inequality:

$$\beta'I_H>I_{TH}>(n-1)\beta'I_L.$$

Considering the possible variations in $\beta'$:

$$\beta'_{MIN}\cdot I_H>I_{TH}>(n-1)\beta'_{MAX}I_L.$$

The output current discrimination may be simply performed by loading the multiplexed output with a resistor connected to a reference voltage. Then the output voltage can be sensed by any suitable circuitry, such as a long-tail pair current switch with a suitable threshold voltage. However, this technique is sensitive to variations in MTL $\beta'$, the absolute values of $I_H$ and $I_L$, the absolute value of the load resistor, and the number of storage cells multiplexed at that output. In practice, for this technique, the ratio of $I_H$ to $I_L$ would have to be very large. Interface circuitry for developing the threshold current $I_{TH}$ and comparing the current output levels from the storage cells will now be described with reference to FIGS. 11, 12 and 13.

Figure 11:
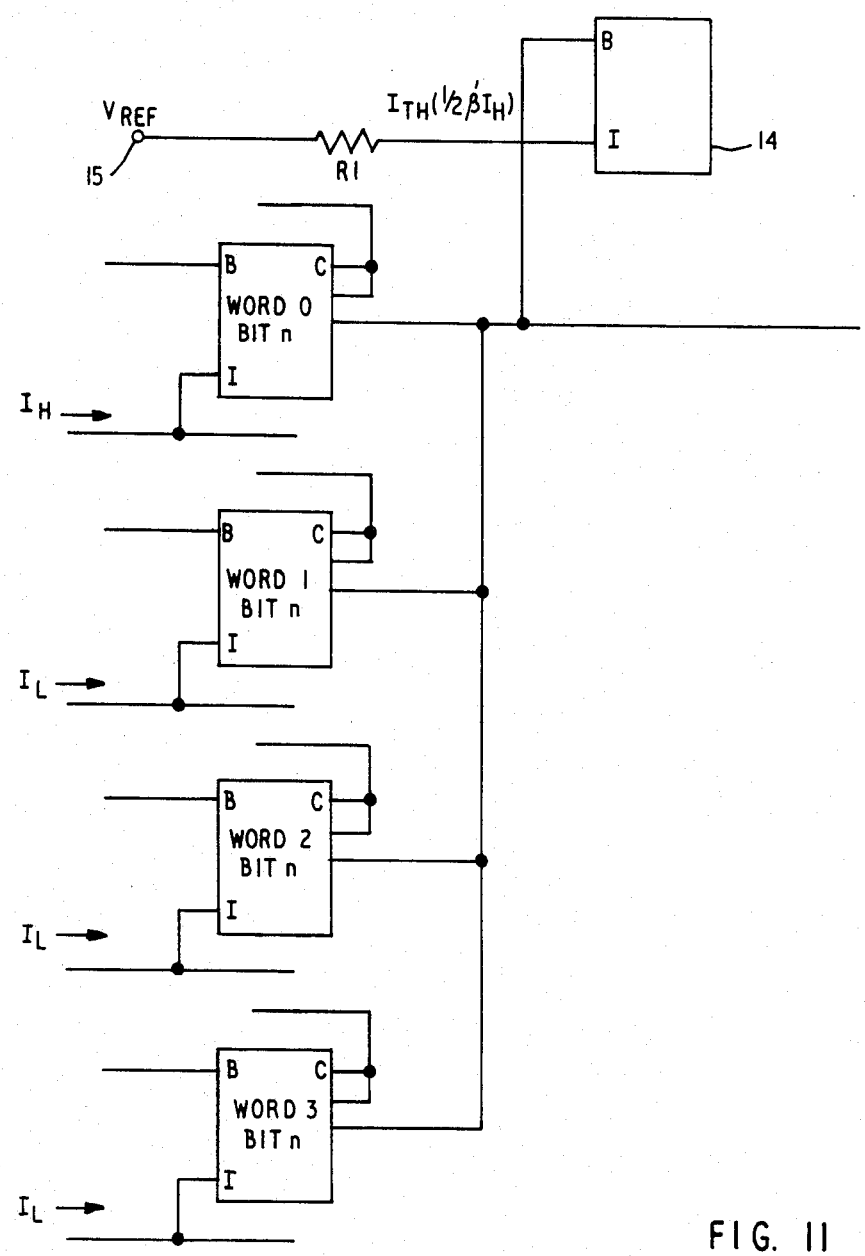
FIG. 11 shows further example of four-way multiplex configuration with output current discrimination.
Figure 12:
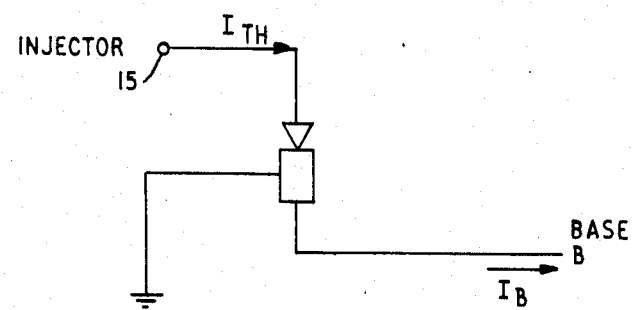

FIG. 11 shows the output gates of four storage cells representing corresponding bit position (bit n) of four words of the storage array shown in FIG. 9. The collector outputs from the gates are connected together as explained to provide the multiplexed output. In the example shown in the figure word 0 is to be read out and accordingly its injector line is in the high current $I_H$ state and the injector line of the remaining words are in the low current $I_L$ state. An interface MTL device 14, to which the threshold current $I_{TH}$ is applied, is connected to the multiplexed output line. The threshold current is generated by means of a reference voltage $V_{REF}$ applied to its input terminal 15. The interface device 14 has one injector, one base and no collectors. Such a device has the great advantage of occupying very little on-chip silicon area. Effectively the device is being used as a pnp transistor with the collector of the pnp as the base node of the MTL device. The base node can supply a current of up to $\alpha I_{INJ}$ (where $\alpha$ is the ratio of the unsaturated collector current to emitter current for the pnp injector device). The equivalent circuit of the interface is shown in FIG. 12.

Figure 13:
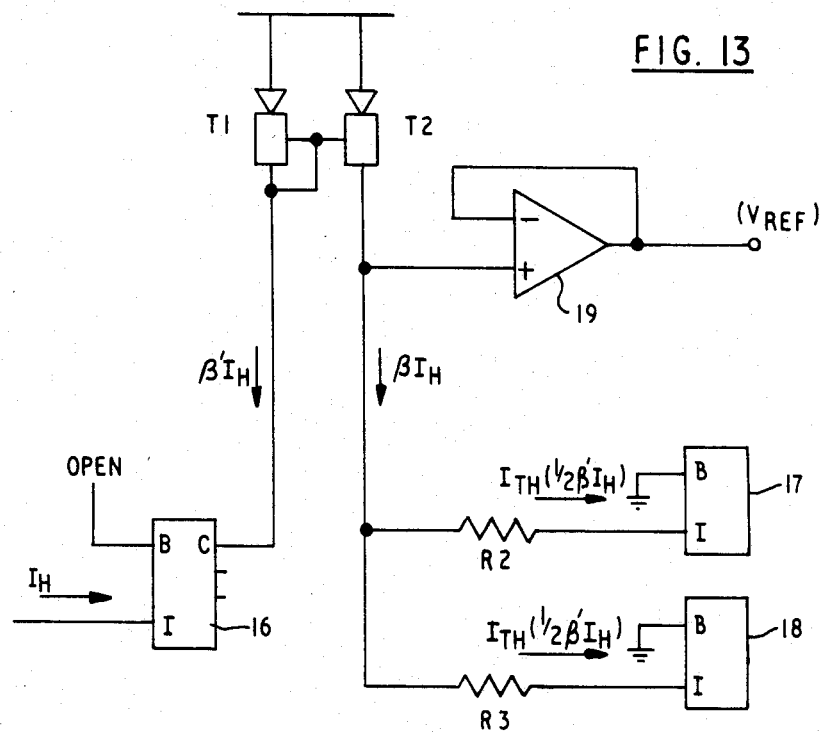
FIG. 13 shows an interface reference voltage generator circuit for generating an input reference voltage for the interface device forming part of FIG. 11 and shown as an equivalent circuit in FIG. 12.

FIG. 13 shows the interface reference voltage generator for generating the reference voltage $V_{REF}$ at the input 15 of the interface device 14. An MTL device 16 is provided with an injector current of $I_H$ (the higher current level) and, because of the open circuit on its base input has a logical ZERO output with its collector current at $\beta'I_H$. This collector current is mirrored by transistors $T_1$ and $T_2$ and applied to the injectors of two more interface devices 17 and 18. The injector current applied to each of these reference interface devices is accordingly $\frac{1}{2}\beta'I_H$. The injector voltage is the $V_{be}$ of the injector pnp device, and therefore is of the order of 0.7 volts. The injector voltage is buffered by a unity gain amplifier 19 to drive the interface reference voltage $V_{REF}$. This interface voltage is therefore the voltage which, when applied to the injector of the interface device 14 (FIG. 11) will produce an injector threshold current $I_{TH}=\frac{1}{2}\beta'I_H$.

Returning to FIG. 11 which shows just one of the several multiplexor configurations required by the storage array. The interface MTL device 14 has the interface reference voltage $V_{REF}$ applied to its injector and therefore its injector current $I_{TH}=\frac{1}{2}\beta'I_H$. The output devices of the storage cells corresponding to the $n^{th}$ bit positions of the words are connected to the base input of the MTL interface device 14. Each gate can be either in the high current state $I_H$ or the low current state $I_L$. The logical output of each storage cell can either be ONE or ZERO. If as shown, the logical output of bit n of word 0 is to be read then a high value read injection current $I_H$ is applied to this storage cell with read injector currents to all other cells at the lower current $I_L$. The sum of the collector currents from the output gates of words 1, 2 and 3 is $n\beta'I_L$, where n is the number of logical ZERO outputs from these cells. The collector current from the storage cell of the selected word 0 is $\beta'I_H$, if it is storing a logical ZERO or zero if it is storing a logical ONE.

The total unsaturated output current is therefore:
$I_{OUT}=n\beta'I_L$ for the cell of word 0 at logical ONE
$I_{OUT}=n\beta'I_L+\beta'I_H$ for the cell of word 0 at logical ZERO.

If $I_{OUT}$ is less than the current that the interface MTL device 14 is capable of supplying, i.e., $\frac{1}{2}\alpha\beta'I_H$, then the interface MTL device saturates and the multiplex output voltage becomes ($V_{REF}-V_{CE}$ saturated). If $I_{OUT}$ is greater than the current that the interface MTL device can supply, then the output collectors of the cells of words 0 to 3 saturate and the multiplex output voltage becomes ($V_{CE}$ saturated).

For MTL devices $V_{CE}$ saturated is of the order of a few tens of millivolts and injector voltages such as $V_{REF}$ are of the order of 0.7 volts. Hence the multiplex output voltages are as follows:

$V_{OUT}$ is approximately 0.7 volts if the cell representing bit n of selected word 0 is storing a logical ONE ($I_{OUT}<\frac{1}{2}\alpha\beta'I_H$) and $V_{OUT}$ is approximately 0 volts if the cell representing bit n of selected word 0 is storing a logical ZERO ($I_{OUT}>\frac{1}{2}\alpha\beta'I_H$).

The logical state of the selected cell has been read and the output voltage can be sensed by any suitable circuitry such as a long-tail-pair current switch with a threshold of 0.35 volts. In a similar manner, the logical states of the corresponding cells of the other words 1, 2 and 3 may be read.

Although the circuit for developing the reference voltage $V_{REF}$ in order to generate a threshold current $I_{TH}$ of $\frac{1}{2}\beta'I_H$ has been described, different levels of $V_{REF}$ could be implemented by changing the number of reference interface devices and/or changing the mirror ratio. The choice of the value of $V_{REF}$ would depend on the maximum number of devices at any multiplex output and on the ratio of $I_H$ to $I_L$. In general, for any such multiplex configuration, it is required that the interface reference current $I_{TH}$ is $1/r\ k\beta'I_H$. $(M-1)\ \beta'I_L<1/r\ k\ \alpha\beta'I_H$
(to detect a logical ONE)

and $\beta'I_H>1/r\ k\ \alpha\beta'I_H$ (to detect a logical ZERO),
where
M is the number of outputs to be multiplexed,
r is the number of reference interface devices and
k is the mirror ratio used in the reference voltage generator.

The design of the current discrimination portion of the circuit takes advantage of tracking. The ratio of $I_H$ to $I_L$ can be kept constant by developing $I_L$ from $I_H$. The interface reference voltage generator circuit develops $I_{TH}$ directly from the logical zero output current of a higher current level MTL gate, thereby causing $I_{TH}$ to track with the MTL gate logical ZERO output current. This tracking ensures insensitivity to any $\beta$—variation in the MTL gates. The resistor $R_1$ in FIG. 11 and resistors $R_2$ and $R_3$ in FIG. 13 in series with the injectors of the interface devices also enhance the design by increasing the value of $V_{REF}$ for the same value of threshold current. Any offset in the amplifier 19 buffering the reference voltage represents a smaller percentage variation in the current applied to the injectors of the interface devices. The effect of any variation in the injector voltage-current characteristics of the interface devices is minimized. The effect of any ground shift will also be minimized.

What is claimed is:

1. Semiconductor integrated word organized storage circuit comprising a two-dimensional matrix of bistable memory cells having first address lines, each associated with a unique group of cells aligned in one coordinate direction and pairs of second address lines, each pair associated with a unique group of cells aligned in the other coordinate direction, each of said memory cells including two cross-coupled merged transistor logic gates, each with an integrated structure arranged as a vertical inverting base transistor having at least one emitter electrode, at least one base electrode and at least one collector electrode, and first and second complementary lateral injector transistors disposed on either side of said inverting base transistor, each said lateral injector transistor having emitter, base and collector electrodes, each of said first address lines being connected to said first injector transistor of each gate in each cell associated therewith, and each of said pairs of second address lines being connected, one to the second injector transistor of one gate and the other to the second injector of the other gate, of each cell associated therewith, an individual output line for each of said cells connected to the inverting base transistor of one of said cross-coupled gates of said cell, first input means associated with said first address lines, second input means associated with said second address lines, and output means associated with said output lines, the logical state of the cells in a common group of cells being selectively set solely by the combined action of said first and second address lines, and said output means including discrimination means for sensing the logical state of a storage cell when its first injector transistors are operating in a high current mode, said first input means associated with said first address lines being controllable selectively to energize the first address lines so as to cause said first injector transistors of all the cells in a group connected to each individual first address line either to adopt a high injection current mode of operation or a low injection current mode of operation, and said second input means associated with said pairs of second address lines being controllable selectively to energize the individual lines of each pair of address lines in order to cause one or the other of the second injector transistors of each associated cell to adopt a medium injection current mode of operation by which means the logical state of the cell may be changed, provided its first injector transistors are operating in low injection current mode but not if they are operating in a high injection current mode.

2. Semiconductor integrated word organized storage circuit as set forth in claim 1 wherein the construction and arrangement of said cells and the relative values of the high and low injection currents applied thereto are such that a cell latched in its first bistable state, representing one logical value, draws zero current over its output line regardless of whether its injectors are operating in high or low injection current mode, whereas a cell latched in the second bistable state, representing the other logical value, draws a relatively high current over its output line when its first injectors are operating in high injection current mode, and draws a relatively low current over its output line when its first injectors are operating in low injection current mode.

3. Semiconductor integrated word organized storage circuit as set forth in claim 2 wherein in write mode, said first input means operates to energize the first address line associated with a group of cells, the logical content of which is to be changed, so as to cause the first injectors thereof to cperate in low injection current mode, and to energize the remaining first address lines associated with the remaining groups of cells, the logical contents of which are not to be changed, so as to cause the first injectors thereof to operate in high injector current mode.

4. Semiconductor integrated word organized storage circuit as set forth in claim 3, wherein in read mode, said first input means operates to energize the first address line associated with a group of cells, the logical content of which is to be interrogated so as to cause the first injectors thereof to operate in high injection current mode, and to energize the remaining first address lines associated with the remaining groups of cells, the logical content of which are not to be interrogated, so as to cause the first injectors thereof to operate in low injector current mode.

5. Semiconductor integrated word organized storage circuit comprising a two-dimensional matrix of bistable memory cells having first address lines, each associated with a unique group of cells aligned in one coordinate direction and pairs of second address lines, each pair associated with a unique group of cells aligned in the other coordinate direction, each of said memory cells including two cross-coupled merged transistor logic gates, each with an integrated structure arranged as a vertical inverting base transistor having at least one emitter electrode, at least one base electrode and at least one collector electrode, and first and second complementary lateral injector transistors disposed on either side of said inverting base transistor, each said lateral injector transistor having emitter, base and collector electrodes, each of said first address lines being connected to said first injector transistor of each gate in each cell associated therewith, and each of said pairs of second address lines being connected, one to the second injector transistor of one gate and the other to the second injector transistor of the other gate, of each cell associated therewith, an individual output line for each of said cells connected to the inverting base transistor of one of said cross-coupled gates of said cell, first input means associated with said first address lines, second input means associated with said second address lines, output means associated with said output lines, the logical state of the cells in a common group of cells being selectively set solely by the combined action of said first and second address lines, and said output means including discrimination means for sensing the logical state of a storage cell when its first injector transistors are operating in a high current mode, said first input means associated with said first address lines being controllable selectively to energize the first address lines so as to cause said first injector transistors of all the cells in a group connected to each individual first address line either to adopt a high injection current mode of operation or a low injection current mode of operation and said second input means associated with said second address lines being controllable selectively to energize the individual lines of each pair of address lines in order to cause one or the other of the second injector transistors of each associated cell to adopt a medium injection current mode of operation by which means the logical state of the cell may be changed, provided its first injector transistors are operating in low injection current mode but not if they are operating in a high injection current mode, the construction and arrangement of said cells and the relative values of the high and low injection currents applied thereto being such that a cell latched in its first bistable state, representing one logical values, draws zero current over its output line regardless of whether its injector transistors are operating in high or low injection current mode, whereas a cell latched in the second bistable state, representing the other logical value, draws a relatively high current over its output line when its first injector transistors are operating in high injection current mode and draws a relatively low current over its output line when its first injector transistors are operating in low injection current mode, in a write mode, said first input means operating to energize the first address line associated with a group of cells, the logical content of which is to be changed, so as to cause the first injector transistors thereof to operate in a low injection current mode and to energize the remaining first address lines associated with the remaining groups of cells, the logical contents of which are not to be changed, so as to cause the first injector transistors thereof to operate in high injection current mode, in a read mode, said first input means operating to energize the first address line associated with a group of cells, the logical content of which is to be interrogated so as to cause the first injector transistors thereof to operate in high injection current mode and to energize the remaining first address lines associated with the remaining groups of cells, the logical contents of which are not to be interrogated, so as to cause the first injector transistors thereof to operate in low injection current mode, groups of said cells associated with said first address lines each storing a word of binary data and said pairs of second address lines being connected to cells storing corresponding bit positions in different words through said matrix, and output multiplexing means connected to the output lines from said cells operable in response to performance of a read operation on a selected word to generate logical signals on multiplex bit output lines representing the logical bit content of the word.

6. Semiconductor integrated word organized storage circuit as set forth in claim 5, wherein the output lines from corresponding bit positions in a word are connected directly together and said multiplexing means includes individual current discrimination circuits, one connected to receive the signal output from each commoned group of bit output lines, the arrangement being such that the magnitude of the maximum value of the sum of relatively low output currents from n−1 cells, where n is the number of words associated with each pair of second address lines, is less than the magnitude of a high output current from the one selected cell the contents of which are being interrogated, and each of said current discriminating circuits being capable of discriminating between the high current value of a selected cell and the sum of the low current values from the unselected cells.

7. Semiconductor integrated word organized storage circuit as set forth in claim 6, wherein said current discriminator includes current threshold device means operable to generate a reference threshold current, the value of which lies between said value of the high output current from a selected cell and the maximum value of current resulting from the sum of the current outputs from all the remaining unselected cells, and an interface device including a pnp semiconductor device, said reference threshold current being supplied to the emitter of said pnp device and said common group of output lines being connected to the collector of the pnp device, the operating characteristics of the pnp device being controlled such that with a high current drawn over any of said output lines, the output device drawing the high current is driven into saturation generating one voltage value at the collector of the pnp device and with zero or low current drawn over any of said output lines, the interface device is driven into saturation generating another voltage value at the collector of the pnp device, and voltage discrimination means attached to the collector of said pnp device operable to discriminate between said one and another voltage values.

8. Semiconductor integrated word organized storage circuit as set forth in claim 7, wherein said interface device is a merged transistor logic gate and said reference current is applied to the emitter of an injector transistor forming part of the gate and the output lines are connected to the collector of the same injector transistor.

9. Semiconductor integrated word organized storage circuit as set forth in claim 8, wherein said current threshold device includes a further merged transistor logic output device for generating a high value output current, means for deriving an appropriate fraction of the high value current, means for converting the fraction of high value current into a corresponding reference voltage and means for generating the threshold current or said interface device from said reference voltage.

10. Semiconductor integrated word organized storage circuit comprising a two-dimensional matrix of bistable memory cells having first address lines, each associated with a unique group of cells aligned in one coordinate direction and pairs of second address lines, each pair associated with a unique group of cells aligned in the other coordinate direction, each of said memory cells including two cross-coupled merged transistor logic gates, each with an integrated structure arranged as a vertical inverting base transistor having at least one emitter electrode, at least one base electrode and at least one collector electrode, and first and second complementary lateral injector transistors disposed on either side of said inverting base transistor, each said lateral injector transistor having emitter, base and collector electrodes, each of said first address lines being connected to said first injector transistor of each gate in each cell associated therewith, and each of said pairs of second address lines being connected, one to the second injector transistor of one gate and the other to the second injector transistor of the other gate, of each cell associated therewith, an individual output line for each of said cells connected to the inverting base transistor of one of said cross-coupled gates of said cell, first input means associated with said first address lines, second input means associated with said second address lines, and output means associated with said output lines, the logical state of the cells in a common group of cells being selectively set solely by the combined action of said first and second address lines, and said output means including discrimination means for sensing the logical state of a storage cell when its first injector transistors are operating in a high current mode, said first input means associated with said first address lines being controllable selectively to energize the first address lines so as to cause said first injector transistors of all the cells in a group connected to each individual first address line either to adopt a high injection current mode of operation or a low injection current mode of operation and said second input means associated with said second address lines being controllable selectively to energize the individual lines of each pair of address lines in order to cause one or the other of the second injector transistors of each associated cell to adopt a medium injection current mode of operation by which means the logical state of the cell may be changed, provided its first injector transistors are operating in low injection current mode but not if they are operating in a high injection current mode, the construction and arrangement of said cells and the relative values of the high and low injection currents applied thereto being such that a cell latched in its first bistable state, representing one logical value, draws zero current over its output line regardless of whether its injector transistors are operating in high or low injection current mode, whereas a cell latched in the second bistable state, representing the other logical value, draws a relatively high current over its output line when its first injector transistors are operating in high injection current mode and draws a relatively low current over its output line when its first injector transistors are operating in low injection current mode;

in a write mode, said first input means operating to energize the first address line associated with a group of cells, the logical content of which is to be changed, so as to cause the first injector transistors thereof to operate in a low injection current mode and to energize the remaining first address lines associated with the remaining groups of cells, the logical contents of which are not to be changed, so as to cause the first injector transistors thereof to operate in high injection current mode;

in a read mode, said first input means operating to energize the first address line associated with a group of cells, the logical content of which is to be interrogated so as to cause the first injector transistors thereof to operate in high injection current mode and to energize the remaining first address lines associated with the remaining groups of cells, the logical contents of which are not to be interrogated, so as to cause the first injector transistors thereof to operate in low injection current mode, said output means including current discrimination circuits capable of discrimination circuits capable of discriminating between said relatively high current output and said relatively low current output on an output line and for providing an output signal indicating the detection of a relatively high output current.

* * * * *